(12) United States Patent
Iguchi

(10) Patent No.: US 6,198,669 B1
(45) Date of Patent: Mar. 6, 2001

(54) SEMICONDUCTOR INTEGRATED CIRCUIT

(75) Inventor: Minoru Iguchi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/418,985

(22) Filed: Oct. 14, 1999

(30) Foreign Application Priority Data

Oct. 26, 1998 (JP) ................................. 10-304295

(51) Int. Cl.$^7$ ..................................... G11C 7/00
(52) U.S. Cl. ................... 365/189.07; 365/201; 365/233
(58) Field of Search ..................... 365/233, 189.05, 365/201, 189.07, 236

(56) References Cited

U.S. PATENT DOCUMENTS 5,327,393 * 7/1994 Koyanagi et al. .................... 365/233
5,587,950 * 12/1996 Sawada et al. ...................... 365/201

FOREIGN PATENT DOCUMENTS 5-289953    11/1993 (JP) .

* cited by examiner

*Primary Examiner*—Huan Hoang
(74) *Attorney, Agent, or Firm*—Young & Thompson

(57) ABSTRACT

A semiconductor integrated circuit includes an incorporated memory unit, a first register unit for storing data to be written in the memory unit as a test circuit for the memory unit, a second register unit for storing a value read out from the memory unit, a comparator unit for comparing values of the first and second register units, and an address generator for generating an address signal of the memory unit on the basis of an external input clock pulse. The memory unit includes a plurality of memories, and the address generator has a memory selector for selecting, among the plurality of memories, a specific one on the basis of the clock pulse. The semiconductor integrated circuit also includes a write control unit and read control unit. The write control unit writes data stored in the first register unit, at an address corresponding to an address signal generated by the address generator. The read control unit stores data read from an address corresponding to an address signal generated by the address generator, in the second register unit. The address generator has a register select signal generator for selecting, among the plurality of registers, a specific one on the basis of the clock pulse.

30 Claims, 7 Drawing Sheets

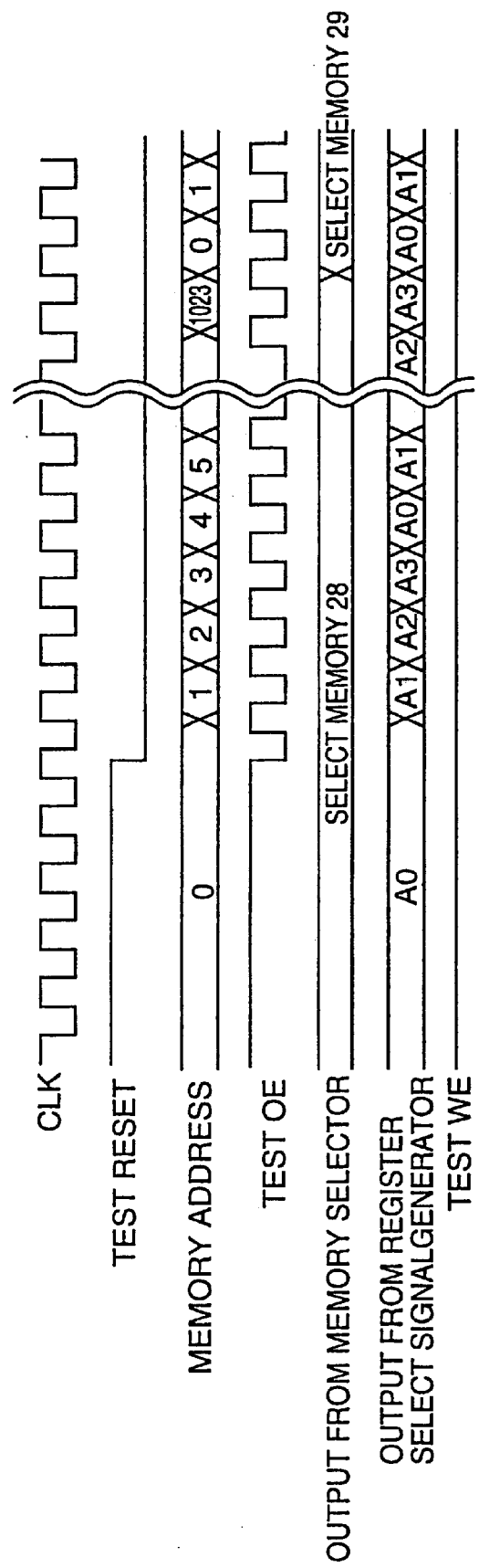

SEMICONDUCTOR INTEGRATED CIRCUIT

BACKGROUND OF THE INVENTION

1. Field of the Invention

The present invention relates to a semiconductor integrated circuit incorporating a large-capacity memory and, more particularly, to a semiconductor integrated circuit capable of realizing downsizing of a package and reduction in number of inspection patterns.

2. Description of the Prior Art

Semiconductor integrated circuits incorporating memories have conventionally been provided. When the incorporated memory of such a semiconductor integrated circuit is to be tested, to supply an address signal indicating the address in the memory or a data signal as data to be written at this address of the memory, these signals must be supplied from the outside by an LSI tester or the like.

For this reason, a conventional semiconductor integrated circuit needs externally connectable pins in a number proportional to the memory capacity, and the number of pins increases in accordance with an increase in memory capacity. When the number of pins increases in this manner, downsizing of the package is interfered with. When the number of pins of the semiconductor integrated circuit increases, the number of probes of the LSI tester also increases, leading to an increase in cost of the test process.

In order to cope with these problems, for example, an integrated circuit disclosed in Japanese Unexamined Patent Publication No. 5-289953 has, regarding an address signal, a counting means and a decoding means. The counting means counts continuously input clock signals. The decoding means decodes a count output from the counting means to generate a select signal that specifies one memory among a plurality of memories, and to generate the address of the specified memory. The package of the integrated circuit accordingly requires neither a test address input pin nor a memory select pin.

FIG. 1 is a block diagram of the integrated circuit disclosed in this Japanese Unexamined Patent Publication No. 5-289953.

This integrated circuit has, as pins to be connected to the outside, a data input pin 1, clock (CLK) pin 2, test reset pin 3, test mode pin 4, and data output pin 5. Each of memories 6, 7, 8, and 9 is a RAM or ROM. Data from the memory 6, 7, 8, or 9 is selected by an output selector 13 that has received an output select signal S1 from a control circuit 10, and is output from the data output pin 5.

The control circuit 10 has a memory address generating counter 11 and memory selector 12. The memory address generating counter 11 counts clock pulses input from the clock pin 2. The count of the memory address generating counter 11 forms an address signal S2 indicating the memory address of either one of the memories 6, 7, 8, and 9. The memory selector 12 outputs an output select signal that selects either one of the memories 6, 7, 8, and 9 upon reception of a predetermined bit of the count of the memory address generating counter 11.

Referring to FIG. 1, in this conventional integrated circuit, as data to be written in the memory 6, 7, 8, or 9, test data is supplied from the data input pin 1. In order to inspect whether the data written in the memory 6, 7, 8, or 9 is correct, the written data is read out from the memory 6, 7, 8, or 9 to output data, and the output data is compared with the input data.

For this reason, in this conventional integrated circuit, a data input pin equivalent to the bit width of the incorporated memory is required. As the bit width of the memory increases, the number of pins increases to accordingly interfere with downsizing of the package.

Furthermore, in order to input/output the test data, the number of inspection patterns increases in proportion to the memory capacity. Accordingly, the test time required for inspection prolongs to increase the cost of inspection.

SUMMARY OF THE INVENTION

The present invention has been made in consideration of the above situation in the prior art, and has as its object to provide a semiconductor integrated circuit in which the package can be further downsized and the number of inspection patterns can be reduced.

In order to achieve the above object, according to the main aspect of the present invention, there is provided a semiconductor integrated circuit comprising: an incorporated memory unit; a first register unit for storing data to be written in the memory unit as a test circuit for the memory unit; a second register unit for storing a value read out from the memory unit; a comparator unit for comparing values of the first and second register units with each other; and address generator for generating an address signal of the memory unit on the basis of an external input clock pulse.

According to the arrangement of the main aspect described above, since a memory address signal and a data signal need not be input from or output to the outside for performing the memory test, a memory data line and a memory address line need not be connected to the terminals of the LSI. Therefore, the number of pins can be reduced, realizing downsizing of the package.

The data signal and memory address signal for the memory test are generated in the semiconductor integrated circuit. Whether the memory unit operates correctly can be checked by referring to only the result of the comparator unit, and only a clock need be supplied from the outside. The number of patterns for inspection by the LSI tester can accordingly be reduced. As a result, the test time can be decreased to reduce the cost.

According to the arrangement of the main aspect described above, even when the capacity of the incorporated memory increases and a plurality of memories are provided, the number of pins connected to the outside does not increase, contributing to downsizing of the package. Also, the cost in the test process can be reduced.

In addition to the main aspect described above, the present invention also has the following auxiliary aspects.

According to the first auxiliary aspect, there is provided a semiconductor integrated circuit wherein the memory unit according to the above main aspect comprises a plurality of memories, and the address generator includes a memory selector for selecting, among the memories, a specific one on the basis of a clock pulse.

According to the second auxiliary aspect, there is provided a semiconductor integrated circuit comprising a write control unit for writing data stored in the first register unit, at an address corresponding to an address signal generated by the address generator according to the main aspect described above.

According to the third auxiliary aspect, there is provided a semiconductor integrated circuit comprising a read control unit for storing data read out from an address corresponding to an address signal generated by the address generator according to the main aspect described above, in the second register unit.

According to the fourth auxiliary aspect, there is provided a semiconductor integrated circuit wherein the write control unit according to the second auxiliary aspect described above writes the data stored in the first register unit, in the plurality of memories simultaneously.

According to the fifth auxiliary aspect, there is provided a semiconductor integrated circuit wherein the address generator according to the main aspect described above has a counter for counting the number of clock pulses, and part or all of a count of the counter forms an address signal.

According to the sixth auxiliary aspect, there is provided a semiconductor integrated circuit wherein each of the first and second register units according to the main aspect described above comprises a plurality of registers.

According to the seventh auxiliary aspect, there is provided a semiconductor integrated circuit wherein a decoder is provided between the address generator and the memory unit so that all of the memories can be selected in a data write in the plurality of memories according to the first auxiliary aspect described above, and a memory can be selected from the plurality of memories in a data read.

The above and many other objects, features and advantages of the present invention will become manifest to those skilled in the art upon making reference to the following detailed description and accompanying drawings in which preferred embodiments incorporating the principle of the present invention are shown by way of illustrative example.

BRIEF DESCRIPTION OF THE DRAWINGS

FIG. 7 is a timing chart of the respective signals in a data read from a memory according to the first embodiment shown in FIG. 2.

DETAILED DESCRIPTION OF THE PREFERRED EMBODIMENTS

Several preferred embodiments of the present invention will be described with reference to the accompanying drawings.

Figure 1:
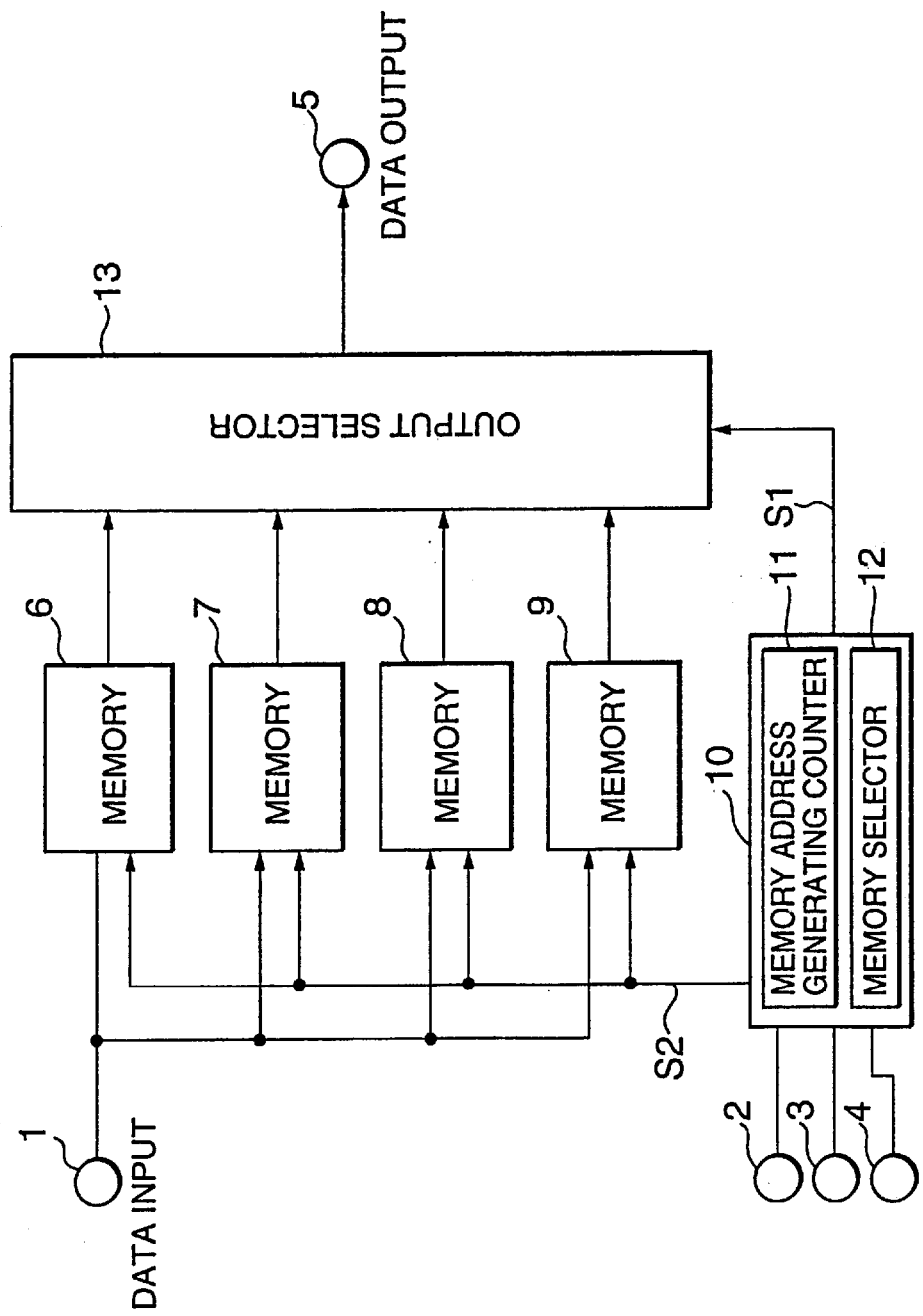
FIG. 1 is a block diagram showing the arrangement of a conventional integrated circuit disclosed in Japanese Unexamined Patent Publication No. 5-289953.
Figure 2:
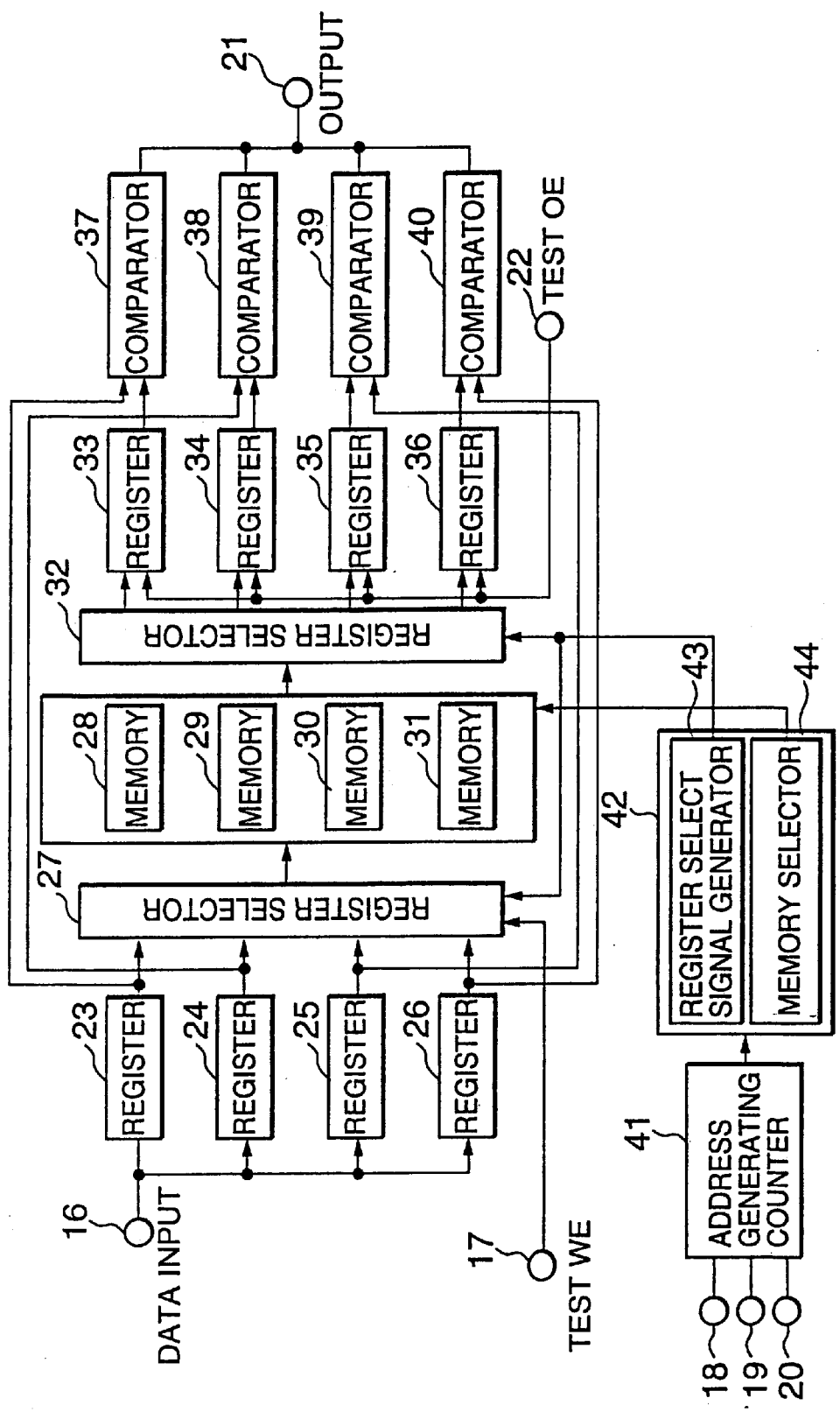
FIG. 2 is a block diagram showing the arrangement of a semiconductor integrated circuit according to the first embodiment of the present invention.

FIG. 2 is a block diagram showing the arrangement of a semiconductor integrated circuit according to the first embodiment of the present invention.

As shown in FIG. 2, the first embodiment will describe a semiconductor integrated circuit having four memories. This semiconductor integrated circuit has a function of testing the four memories.

This semiconductor integrated has, as pins to be connected to the outside, a data input pin 16, test WE (Write Enable) pin 17, clock (CLK) pin 18, test reset pin 19, test mode pin 20, test result output pin 21, and test OE (Out Enable) pin 22.

Memories 28, 29, 30, and 31, each of which is a RAM or ROM, constitute a memory unit. In the first embodiment, the memories 28, 29, 30, and 31 are to be tested.

Registers 23, 24, 25, and 26 constitute the first register unit and store data to be written in the memories 28, 29, 30, and 31 for testing. Prior to the test, arbitrary data are input to and stored in the registers 23, 24, 25, and 26 through the data input pin 16.

An address generating counter 41 is incremented by a clock pulse having a certain predetermined period. The count of the address generating counter 41 is cleared to zero by a reset signal. The clock pulse is input from the clock pin 18, and the reset signal is input from the test reset pin 19. An output from the address generating counter 41 directly forms the addresses of the memories 28 to 31.

An address generating decoder 42 is comprised of a memory selector 44 and register select signal generator 43. The memory selector 44 decodes the output from the address generating counter 41 to select a memory to be tested. The register select signal generator 43 selects either one of the registers 23 to 26 with a register selector 27 and selects either one of registers 33 to 36 constituting the second register unit with a register selector 32.

The registers 33 to 36 respectively read out tested data from the memories 28 to 31 and store them. Either one of the registers 33 to 36 is selected by the address generating decoder 42 to receive data read from the memories 28 to 31.

Comparators 37 to 40 constituting a comparator unit compare data written in the memories 28 to 31 with data read out from the memories 28 to 31. The comparators 37 to 40 respectively compare the values from the registers 23 to 26 with the values from the registers 33 to 36.

The comparison results of the comparators 37 to 40 are output to the test result output pin 21. From the results output from the test result output pin 21, an LSI tester checks whether the memories 28 to 31 operate correctly.

A test mode signal is input from the test mode pin 20. When the test mode signal is 1, this semiconductor integrated circuit is set in the memory test mode.

Figure 3:
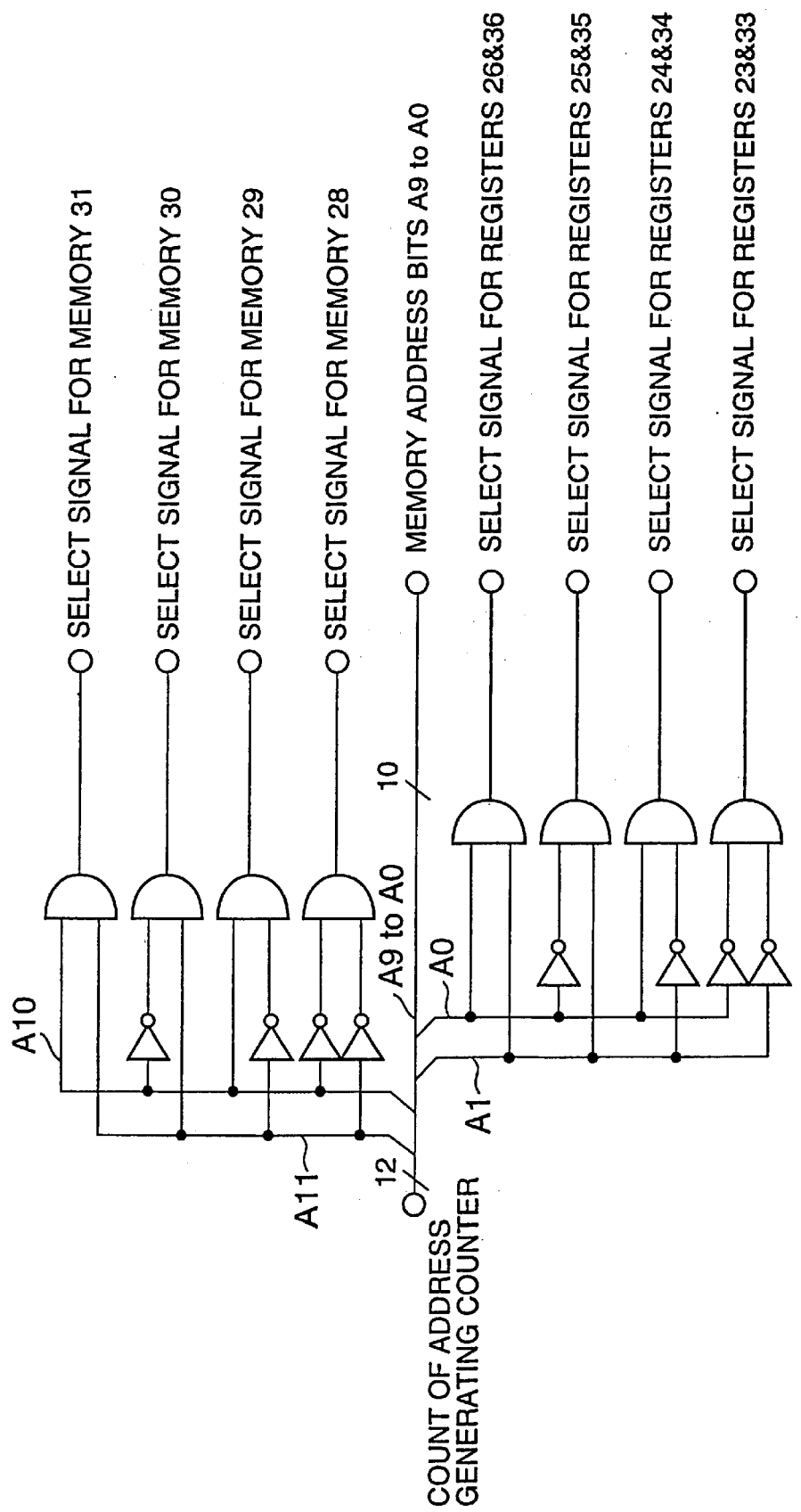
FIG. 3 is a circuit diagram showing an arrangement of the address generating decoder shown in FIG. 2.

FIG. 3 is a circuit diagram showing an arrangement of the address generating decoder 42 shown in FIG. 2.

In the first embodiment, the address generating counter 41 outputs a 12-bit count. In FIG. 3, the respective bits of the count from the address generating counter 41 are indicated by A0 to A11. The least significant bit is A0 and the most significant bit is A11.

Referring to FIG. 3, a signal that selects either one of the registers 23 to 26 and either one of the registers 33 to 36 can be formed by decoding the lower two bits of the output from the address generating counter 41.

A signal that selects, of the memories 28 to 31, one which is to be tested changes depending on the number of memories to be tested and the address spaces of the respective memories. For example, as shown in FIG. 2, when the number of memories to be tested is four and each of all the memory spaces corresponds to 1024 words, the signal that selects a memory to be tested can be formed by decoding the upper two bits of the output from the address generating counter 41.

Operation that takes place when actually performing a test with the circuit shown in FIG. 2 will be described.

A signal indicating that an incorporated memory is to be tested is input from the test mode pin 20. If the test is to be canceled halfway and is to be performed again from the beginning, a reset signal is input from the test reset pin 19 to reset the count of the address generating counter 41 to 0.

When the test is started, a clock signal having a predetermined period is supplied from the clock pin 18, and the count of the address generating counter 41 is incremented, from the initial state of 0, every time one pulse of this clock signal is input.

The register select signal generator 43 of the address generating decoder 42 decodes the lower two bits of the count of the address generating counter 41 to select either one of the registers 23 to 26. The memory selector 44 decodes the upper two bits of the count of the address generating counter 41 to select one of the four memories 28 to 31.

Data to be written in the memories 28 to 31 must be set at arbitrary values prior to the start of the test. These data are written in the registers 23 to 26 from the data input pin 16 in advance.

When the write test to the memories 28 to 31 is started, the count of the address generating counter 41 is incremented by the sequentially input clock signals. The signal for selecting either one of the registers 23 to 26 repeatedly selects the registers 23 to 26 sequentially.

Figure 6:
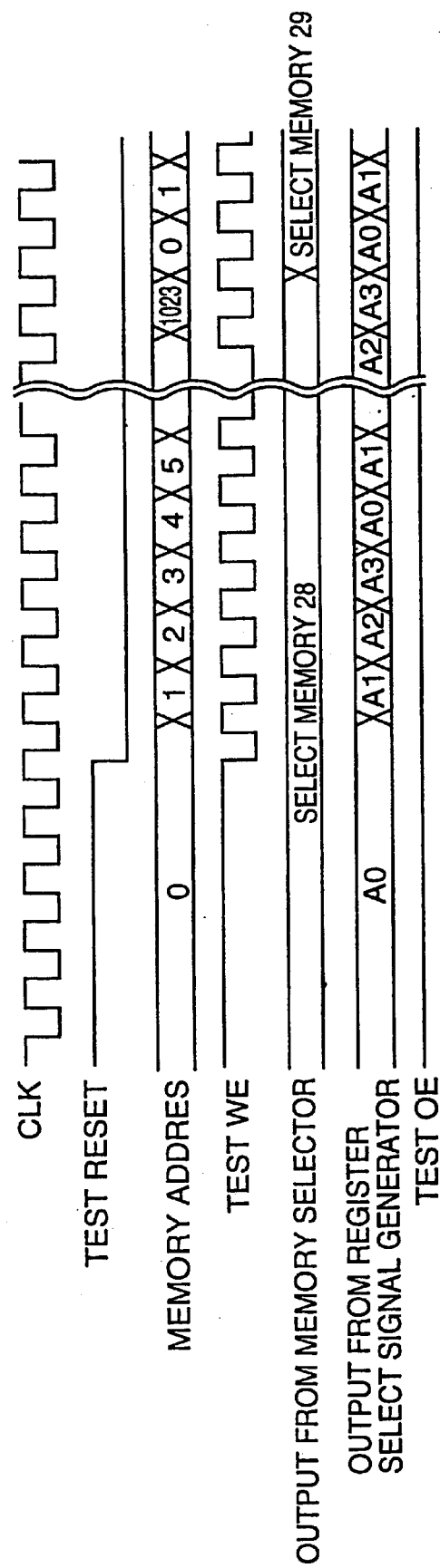
FIG. 6 is a timing chart of the respective signals in a data write in a memory according to the first embodiment shown in FIG. 2.

Data stored in the registers 23 to 26 are loaded to the respective memories 28 to 31 through the register selector 27. At this time, a signal from the test WE pin 17 is input to the register selector 27 at a timing shown in FIG. 6, and an H signal is input from the test OE pin 22.

When the data are written in all the selected memories, the count of the address generating counter 41 changes from 0FFH to 100H. Thus, memory selection by the address generating decoder 42 changes from the memory 28 to the memory 29, and similarly data is written starting with address 0. When this operation is performed until the memory 31, the write in the respective memories is ended.

In a read from the respective memories, in the same manner as in the data write, a test mode signal is input from the test mode pin 20, and a clock pulse having a predetermined period is input from the clock pin 18, to read data from the memory 28 starting with address 0.

At this time, since data is to be read out from the memory, a signal from the test OE pin 22 is input from the LSI tester at the timing shown in FIG. 7, and an H signal is input from the test WE pin 17. Data read out from the memory 28 are sequentially stored in the registers 33 to 36 through the register selector 32.

The comparator 37 compares the value of the register 23 with that of the register 33, and outputs a comparison result indicating whether the two values are identical to the test result output pin 21. Likewise, the value of the register 24 and that of the register 34 are compared by the comparator 38, the value of the register 25 and that of the register 35 are compared by the comparator 39, and the value of the register 26 and that of the register 36 are compared by the comparator 40. Each comparison result is output to the test result output pin 21.

A semiconductor integrated circuit according to the second embodiment of the present invention will be described.

Figure 4:
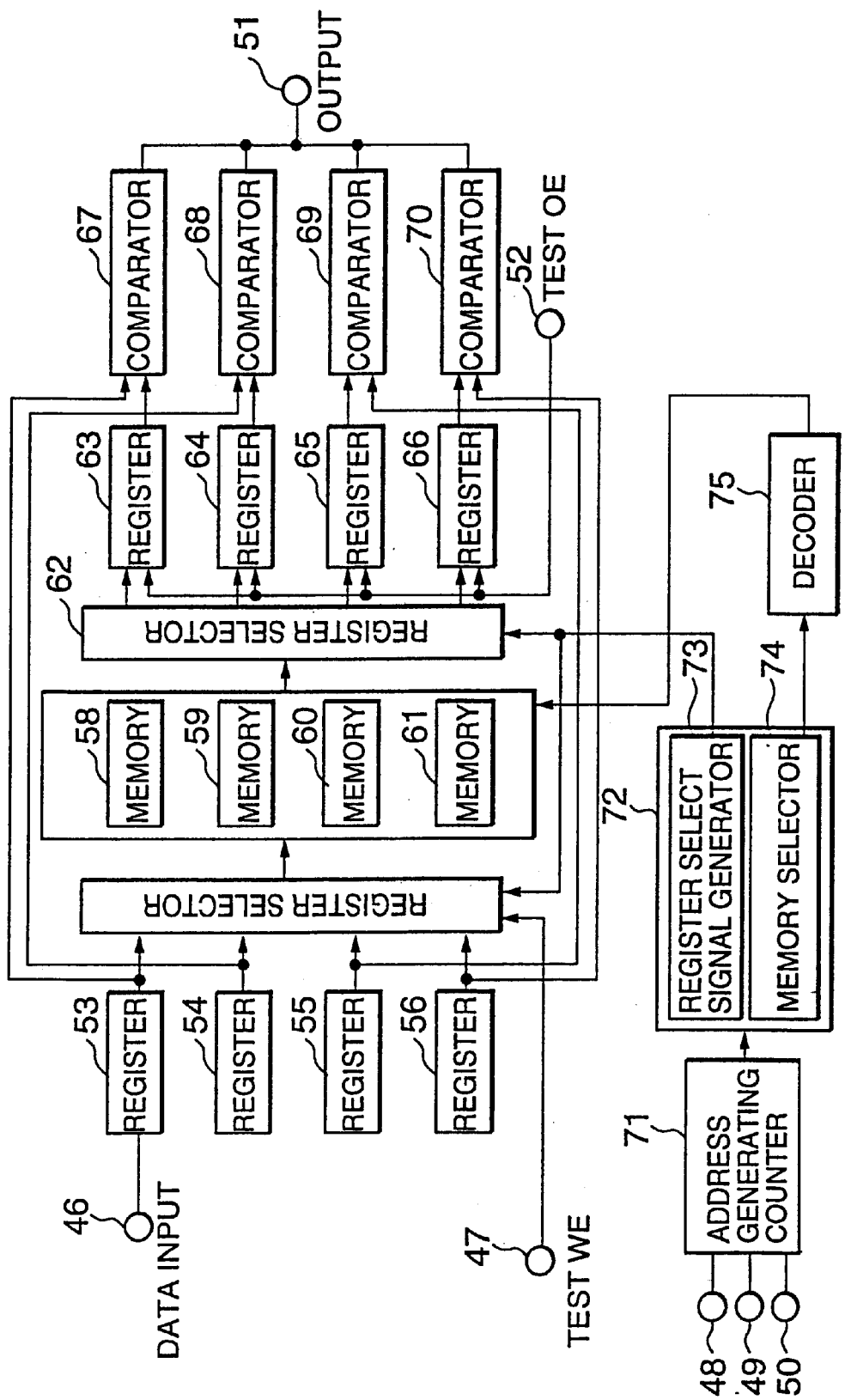
FIG. 4 is a block diagram showing the arrangement of a semiconductor integrated circuit according to the second embodiment of the present invention.

FIG. 4 is a block diagram showing the arrangement of the semiconductor integrated circuit according to the second embodiment of the present invention.

As shown in FIG. 4, the second embodiment will also describe a semiconductor integrated circuit having four memories. This semiconductor integrated circuit has a function of testing the four memories.

This semiconductor integrated has, as pins to be connected to the outside, a data input pin 46, test WE (Write Enable) pin 47, clock (CLK) pin 48, test reset pin 49, test mode pin 50, test result output pin 51, and test OE (Out Enable) pin 52.

Each of memories 58, 59, 60, and 61 is a RAM or ROM. In the second embodiment, the memories 58, 59, 60, and 61 are to be tested.

Registers 53, 54, 55, and 56 store data to be written in the memories 58, 59, 60, and 61 for testing. Prior to the test, arbitrary data are input to and stored in the registers 53, 54, 55, and 56 through the data input pin 46.

An address generating counter 71 is incremented by a clock pulse having a certain predetermined period. The count of the address generating counter 71 is cleared to zero by a reset signal. The clock pulse is input from the clock pin 48, and the reset signal is input from the test reset pin 49. An output from the address generating counter 71 directly forms the addresses of the memories 58 to 61.

An address generating decoder 72 is comprised of a memory selector 74 and register select signal generator 73. The memory selector 74 decodes the output from the address generating counter 71 to select a memory to be tested. The register select signal generator 73 selects either one of the registers 53 to 56 with a register selector 57, and selects either one of registers 63 to 66 with a register selector 62.

The basic arrangement of the second embodiment is identical to that of the first embodiment shown in FIG. 2. In the second embodiment, the memory test circuit is improved more than in the first embodiment.

Referring to FIG. 4, a decoder 75 is further provided between the memory selector 74 of the address generating decoder 72 and the memories 58 to 61 to be tested.

Figure 5:
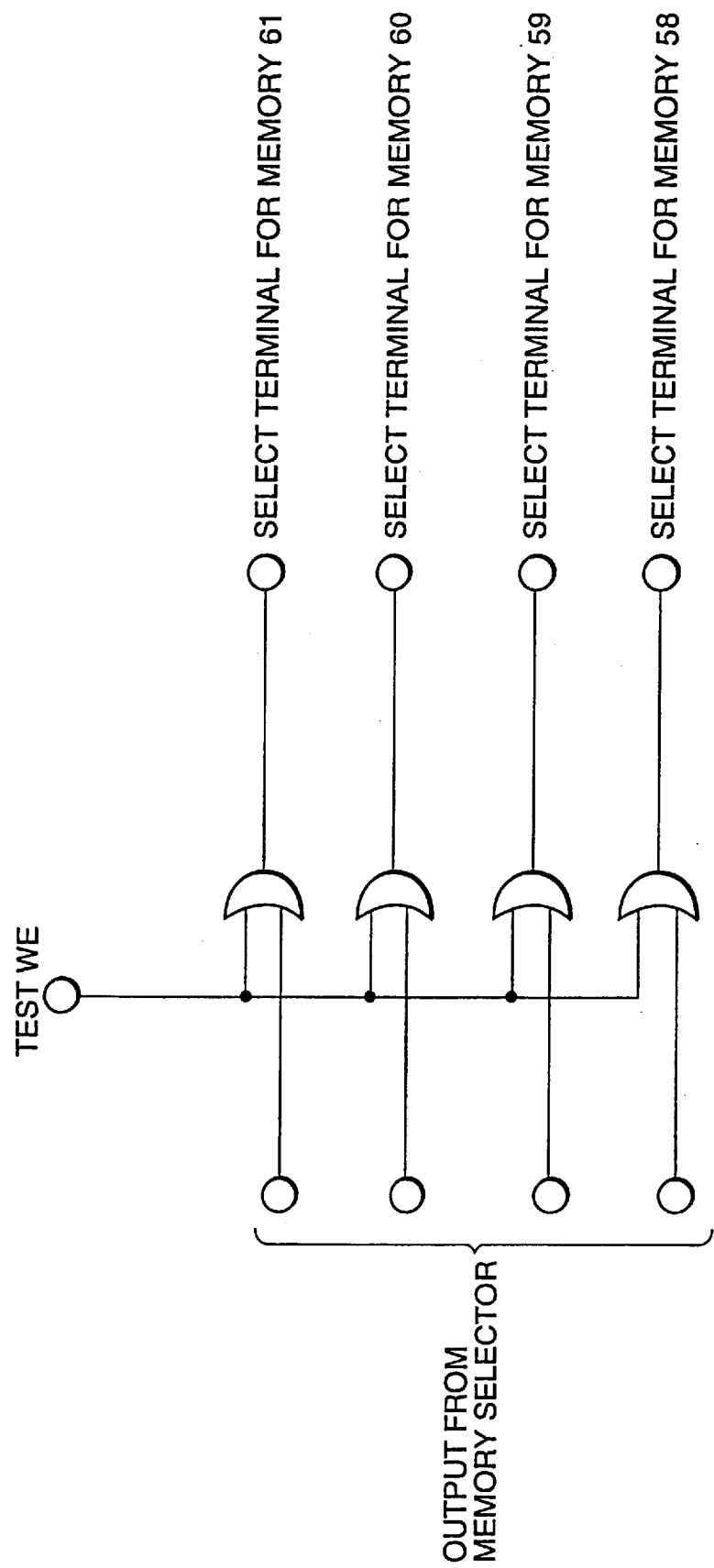
FIG. 5 is a circuit diagram showing an arrangement of the decoder shown in FIG. 4.

FIG. 5 is a circuit diagram showing an arrangement of the decoder 75 shown in FIG. 4.

If the decoder 75 is formed as shown in FIG. 5, in a data write in the memories 58 to 61, all the memories can be selected. In a data read from the memories 58 to 61, the memories to be tested can be sequentially selected.

Therefore, when this decoder 75 is used, a time required for writing data in the memory test is shortened, so that the cost of inspecting the LSI can be further decreased.

What is claimed is:

1. A semiconductor integrated circuit comprising:
    address generating means for generating an address signal of an incorporated memory unit based on an incremented count of pulses of an external input clock pulse;
    a first register unit for storing data to be written in said memory unit; and
    write control means for writing data stored in said first register unit at, among addresses of said memory unit, an address specified by the address signal generated by said address generating means.

2. A circuit according to claim 1, wherein said first register unit comprises a plurality of registers.

3. A circuit according to claim 1, wherein said address generating means has a counter for counting the number of clock pulses, and part or all of a count of said counter forms the address signal.

4. A circuit according to claim 3, wherein said first register unit comprises a plurality of registers.

5. A circuit according to claim 1, wherein said memory unit comprises a plurality of memories, and said address generating means includes a memory selector for selecting, among said plurality of memories, a specific one on the basis of the clock pulse.

6. A circuit according to claim 5, wherein said first register unit comprises a plurality of registers.

7. A circuit according to claim 5, wherein said address generating means has a counter for counting the number of clock pulses, and part or all of a count of said counter forms the address signal.

8. A circuit according to claim 7, wherein said second register unit comprises a plurality of registers.

9. A circuit according to claim 5, wherein said write control means writes the data stored in said first register unit in said plurality of memories simultaneously.

10. A circuit according to claim 9, wherein said address generating means has a counter for counting the number of clock pulses, and part or all of a count of said counter forms the address signal.

11. A circuit according to claim 9, wherein said first register unit comprises a plurality of registers.

12. A circuit according to claim 1, further comprising:
a second register unit for storing data read from said memory unit;
read control means for storing data read out from said memory unit at, among the addresses thereof, one specified by the address signal generated by said address generating means, in said second register unit; and
comparing means for comparing values stored in said first and second register units with each other.

13. A circuit according to claim 12, wherein said address generating means has a counter for counting the number of clock pulses, and part or all of a count of said counter forms the address signal.

14. A circuit according to claim 12, wherein said second register unit comprises a plurality of registers.

15. A circuit according to claim 12, wherein said memory unit comprises a plurality of memories, and said address generating means includes a memory selector for selecting, among said plurality of memories, a specific memory on the basis of said clock pulse.

16. A circuit according to claim 15, wherein said second register unit comprises a plurality of registers.

17. A circuit according to claim 15, wherein said address generating means has a counter for counting the number of clock pulses, and part or all of a count of said counter forms the address signal.

18. A circuit according to claim 17, wherein said comparator unit comprises a plurality of comparators.

19. A circuit according to claim 15, wherein said write control means writes the data stored in said first register unit, in said plurality of memories simultaneously.

20. A circuit according to claim 19, wherein said second register unit comprises a plurality of registers.

21. A circuit according to claim 19, wherein said address generating means has a counter for counting the number of clock pulses, and part or all of a count of said counter forms the address signal.

22. A circuit according to claim 21, further comprising decoder means arranged between said address generating means and said memory unit so that all of said memories can be selected in a data write in said plurality of memories, and specific ones can be sequentially selected from said memories in a data read from said plurality of memories.

23. A semiconductor integrated circuit comprising:
an incorporated memory unit;
a first register unit for storing data to be written in said memory unit as a test circuit for said memory unit;
a second register unit for storing a value read out from said memory unit;
a comparator unit for comparing values of said first and second register units with each other; and
address generating means for generating an address signal of said memory unit on the basis of an external input clock pulse.

24. A circuit according to claim 23, wherein said address generating means has a counter for counting the number of clock pulses, and part or all of a count of said counter forms an address signal.

25. A circuit according to claim 23, wherein each of said first and second register units comprises a plurality of registers.

26. A circuit according to claim 25, wherein said address generating means includes a register select signal generator for selecting, among said plurality of registers, a specific one on the basis of said clock pulse.

27. A circuit according to claim 23, wherein said memory unit comprises a plurality of memories, and said address generating means includes a memory selector for selecting, among said plurality of memories, a specific one on the basis of the clock pulse.

28. A circuit according to claim 27, further comprising a read control unit for storing data read from an address corresponding to an address signal generated by said address generating means, in said second register unit.

29. A circuit according to claim 27, further comprising a write control unit for writing data stored in said first register unit, at an address corresponding to an address signal generated by said address generating means.

30. A circuit according to claim 29, wherein said write control unit writes the data stored in said first register unit, in said plurality of memories simultaneously.

* * * * *